(12) United States Patent
Chen

(10) Patent No.: US 6,818,967 B2
(45) Date of Patent: Nov. 16, 2004

(54) FABRICATING METHOD OF LOW TEMPERATURE POLY-SILICON FILM AND LOW TEMPERATURE POLY-SILICON THIN FILM TRANSISTOR

(75) Inventor: Yun-Sheng Chen, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/612,607

(22) Filed: Jul. 1, 2003

(65) Prior Publication Data

US 2004/0206986 A1 Oct. 21, 2004

(30) Foreign Application Priority Data

Apr. 16, 2003 (TW) .................................... 92108768 A

(51) Int. Cl.$^7$ .............................................. H01L 23/58
(52) U.S. Cl. .................... 257/638; 257/359; 257/617; 257/618; 257/629; 438/164
(58) Field of Search ................. 257/359, 617–618, 257/629, 638; 438/164

(56) References Cited

U.S. PATENT DOCUMENTS

| | | | | |
|---|---|---|---|---|
| 5,888,295 A | * | 3/1999 | Sandhu et al. ................ 117/89 |
| 5,888,856 A | * | 3/1999 | Hamada ...................... 438/162 |
| 6,011,275 A | * | 1/2000 | Ohtani et al. ................. 257/59 |
| 6,124,154 A | * | 9/2000 | Miyasaka .................... 438/151 |
| 6,187,628 B1 | * | 2/2001 | Thakur et al. .............. 438/255 |
| 6,207,483 B1 | * | 3/2001 | Fu et al. ..................... 438/199 |
| 6,207,969 B1 | * | 3/2001 | Yamazaki .................... 257/49 |
| 6,281,700 B1 | * | 8/2001 | Matsueda ................... 324/770 |
| 6,300,927 B1 | * | 10/2001 | Kubota et al. ................ 345/92 |
| 6,337,173 B2 | * | 1/2002 | Jen et al. .................... 430/313 |
| 6,368,887 B1 | * | 4/2002 | Lowrey et al. ............... 438/17 |
| 6,559,040 B1 | * | 5/2003 | Yu et al. ..................... 438/585 |

* cited by examiner

*Primary Examiner*—Michael Trinh
*Assistant Examiner*—Ida M. Soward
(74) *Attorney, Agent, or Firm*—J.C. Patents

(57) ABSTRACT

A fabricating method of low temperature poly-silicon film is described. An amorphous silicon layer is formed on a substrate first; then, an anneal treatment is performed on the amorphous silicon layer for forming a poly-silicon layer (poly-silicon film) from the amorphous silicon layer. Several mounds are formed on the surface of the poly-silicon layer. A surface treatment step is performed; then, another laser anneal step is conducted on the poly-silicon layer. Since the size of these mounds on the surface of the poly-silicon layer can be reduced, the issue that the mounds are too big and have different sizes in the prior art can be resolved.

2 Claims, 2 Drawing Sheets

FABRICATING METHOD OF LOW TEMPERATURE POLY-SILICON FILM AND LOW TEMPERATURE POLY-SILICON THIN FILM TRANSISTOR

CROSS-REFERENCE TO RELATED APPLICATION

This application claims the priority benefit of Taiwan application serial no. 92108768, filed Apr. 16, 2003.

BACKGROUND OF THE INVENTION

1. Field of Invention

The present invention relates to a film fabricating method and a switching element, and more particularly, to a fabricating method of a low temperature poly-silicon film and a low temperature poly-silicon thin film transistor.

2. Description of Related Art

Switches are typically disposed in the general element for driving its operation. The switches disposed in the display element are divided into an active matrix switch and a passive matrix switch. Since the active matrix disposing method is advantageous in its continuously emitting and low voltage driving, this type of disposing method has been widely applied in display elements in recent years. The switches in the active matrix display element may be a thin film transistor (TFT) or a film diode. According to the different materials used to from the channel, the thin film transistor can be an amorphous silicon (a—Si) TFT or a poly-silicon TFT. Since the poly-silicon TFT consumes lower power and has a greater electron migration rate when it is compared with the amorphous silicon TFT, it has gradually drawn more attention from the market.

Since the selection of the substrate material is significantly limited, the early age fabricating temperature of the poly-silicon TFT is up to 1000° C. However, due to the recent, great development of the laser, the fabricating temperature can be lowered to below 600° C. The poly-silicon TFT obtained from such fabricating method is called as a low temperature poly-silicon (LTPS) TFT.

FIG. 1 schematically shows a sectional view of a conventional low temperature poly-silicon film.

Referring to FIG. 1, in the LTPS TFT fabricating process, one of the steps is forming a poly-silicon layer 102 (poly-silicon film) on the substrate 100, and a source/drain (not shown) and a channel (not shown) are then formed on the poly-silicon layer 102 in a subsequent fabricating process. The fabricating method of the poly-silicon layer 102 converts an original amorphous silicon layer into a poly-silicon layer via the laser crystallization or the excimer laser annealing (ELA) anneal treatment. However, after the anneal treatment is completed, a plurality of mounds 104 (as shown in FIG. 1) are formed on the surface of the poly-silicon layer 102, the mounds 104 are formed due to the amorphous silicon layer being re-aligned to form the poly-silicon layer after it is re-crystallized during the annealing fabricating process. During the re-crystallization process, part of the amorphous silicon is used as a crystal seed for the re-crystallization first, then it becomes a larger crystal after the crystal grows, and the larger crystals continuously grow and, further, become integrated together to form an even larger crystal. However, during the integration process, since the crystals are impacted by the interaction resulting from its stress, some of the crystal is pushed to the surface of the poly-silicon layer 102 and thus forms the mounds 104, wherein the height/width ratio of the mounds 104 is about 0.45 (height is 106 and width is 108).

The size of the mounds on the surface impacts the current characteristic of the LTPS TFT, especially when the size of the mounds is increased to a certain extent, the current on the TFT is then changed; thus, the emitting characteristic of the display element is impacted when these TFT are used as the switches of the display element. Further, if the sizes of the mounds are quite different, the current characteristic of each TFT in display will not be the same, and the display uniformity of the display panel is impacted accordingly. Therefore, the mound on the surface of the poly-silicon layer is a major concern of the LTPS TFT fabricating process.

SUMMARY OF THE INVENTION

It is an object of the present invention to provide a fabricating method of a low temperature poly-silicon film, so as to solve the various problems caused by the oversize of the mounds on the surface of the poly-silicon layer which is obtained by using the conventional technique.

It is an further object of the present invention to provide a LTPS TFT, so as to solve the problem of inconsistent current characteristic of the element caused by the oversize of the mounds existing on the surface of the poly-silicon layer of the conventional LTPS TFT.

The present invention provides a fabricating method of the LTPS TFT. An amorphous silicon layer is formed on a substrate first, and then a first anneal treatment is performed on the amorphous silicon layer for forming a poly-silicon layer from the amorphous silicon layer, wherein the first anneal treatment is such as a laser anneal treatment. During the anneal treatment, a plurality of mounds are formed on the surface of the poly-silicon layer, and an oxide layer is also formed on the surface of the poly-silicon layer (including the mounds). Then, the substrate is immerged into a 1%~15% concentration hydrofluoric acid for 1~5 minutes to perform a surface etching treatment so as to remove the oxide layer. Then, a second anneal treatment is performed on the poly-silicon layer, and the second anneal treatment is such as the laser anneal treatment. After two anneal treatments, the height/width ratio of the mounds on the surface of the poly-silicon layer is less than 0.2. Optionally, in the fabricating method mentioned above, a buffer layer can be formed on the substrate and an amorphous silicon layer is formed on the buffer layer before the poly-silicon layer is formed.

A LTPS TFT provided by the present invention comprises a poly-silicon layer, a gate isolation layer, a gate, a dielectric layer, a source metal layer, and a drain metal layer. The poly-silicon layer is deposited on a substrate, and a plurality of mounds is formed on the poly-silicon layer wherein the height/width ratio of the mounds is less than 0.2. The poly-silicon layer further comprises a source/drain and a channel deposited in between the source/drain. Further, the gate isolation layer is deposited on the substrate and covers the poly-silicon layer. The gate is correspondingly deposited on the gate isolation layer which is deposited above the channel. The dielectric layer is deposited on the gate isolation layer and covers the gate and gate isolation layer. The source metal layer and the drain metal layer are deposited on the surface of the dielectric layer and in the dielectric layer and the gate isolation layer, respectively. Wherein, the source metal layer is electrically connected to the source, and the drain metal layer is electrically connected to the drain.

Therefore, the fabricating method of the low temperature poly-silicon film and the LTPS TFT mentioned above is able to solve the problem of the oversize mound formed on the surface of the low temperature poly-silicon layer in the prior art. Accordingly, the present invention can improve the current uniformity of the TFT and further improve the display uniformity of the display panel.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a sectional view of a conventional low temperature poly-silicon film.

DESCRIPTION OF THE PREFERRED EMBODIMENTS

FIG. 2A through FIG. 2D are the sectional views of a fabricating process of a low temperature poly-silicon film of a preferred embodiment according to the present invention. FIG. 3 schematically shows a sectional view of a LTPS TFT of a preferred embodiment according to the present invention.

Figure 1:
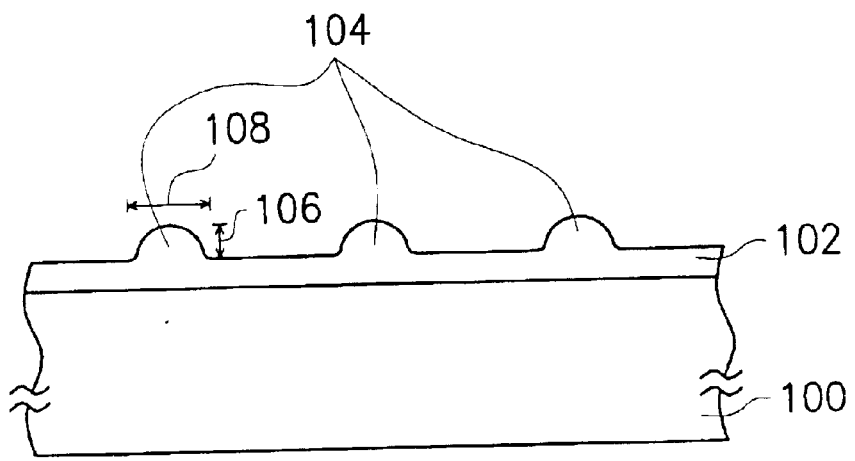
Figure 2A:
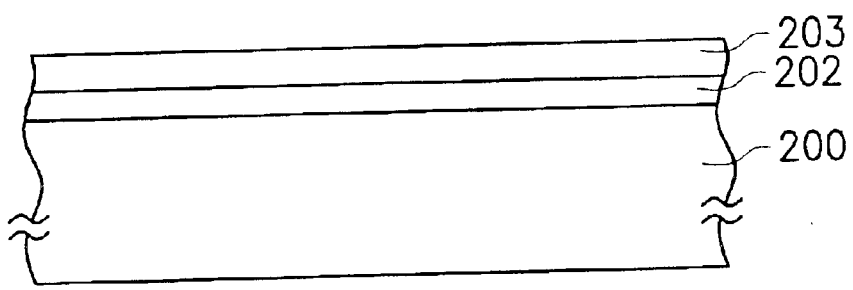
FIG. 2A through FIG. 2D are the sectional views of a fabricating process of a low temperature poly-silicon film of a preferred embodiment according to the present invention.
Figure 2B:
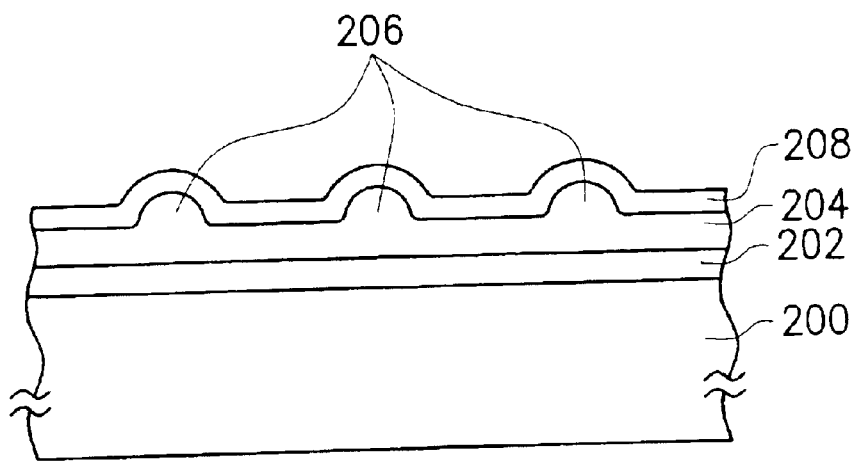
Figure 3:
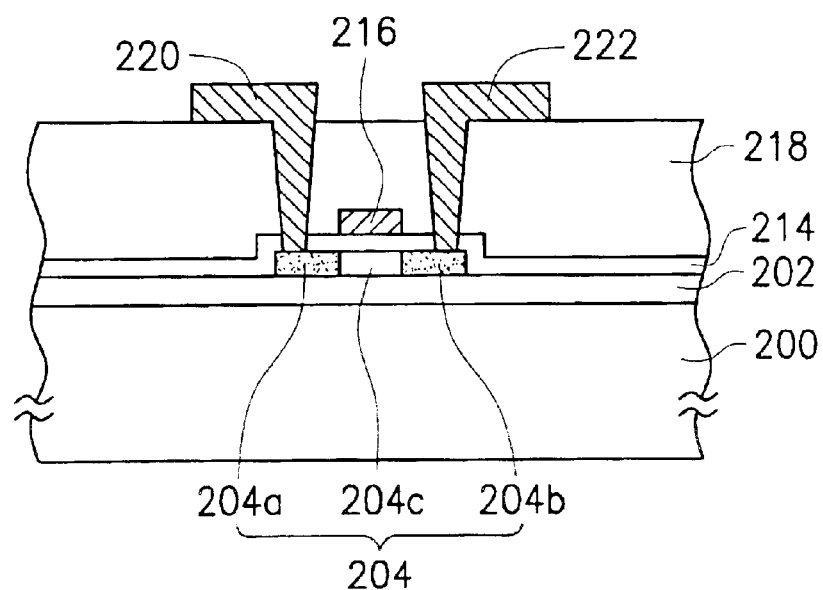
FIG. 3 schematically shows a sectional view of a LTPS TFT of a preferred embodiment according to the present invention.

Referring to FIG. 2A, a substrate 200 is first provided by the fabricating method of the LTPS TFT, wherein the substrate 200 is such as a glass substrate. An amorphous silicon layer 203 is then formed on the substrate 200, and a first anneal treatment is performed on the amorphous silicon layer 203, wherein the first anneal treatment is such as a laser anneal treatment. During the first anneal treatment, the amorphous silicon layer 203 is re-aligned and forms a poly-silicon layer 204 after it is re-crystallized, and a plurality of mounds 206 are formed on the surface of the poly-silicon layer 204 as shown in FIG. 2B.

It is to be noted that during the re-crystallization process, part of the amorphous silicon is used as a crystal seed for the re-crystallization first, then it becomes a larger crystal after the crystal grows, and the larger crystals continuously grow and, further, become integrated together to form an even larger crystal. However, during the integration process, since the crystals are impacted by the interaction resulting from its stress, some of the crystal is pushed to the surface of the poly-silicon layer 204 and thus forms the mounds 206.

Further, the surface of the poly-silicon layer 204 (including the mounds 206) has a contact with the humidity or the oxygen in the atmosphere, thus an oxide layer 208 is further formed on the surface of the poly-silicon layer 204.

Figure 2C:
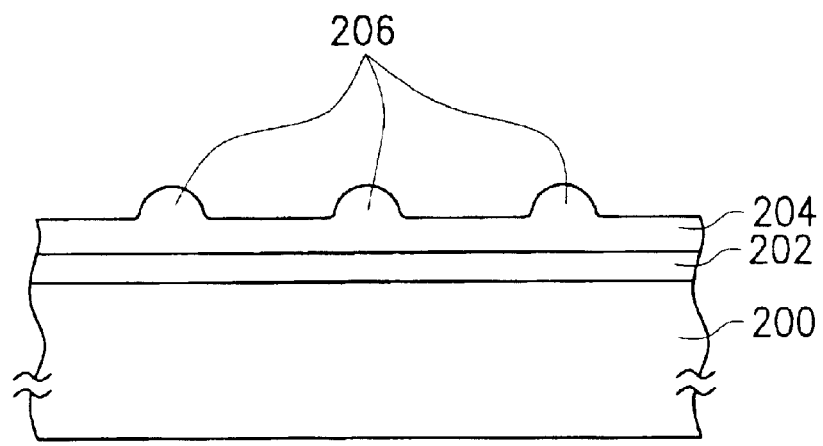
Figure 2D:
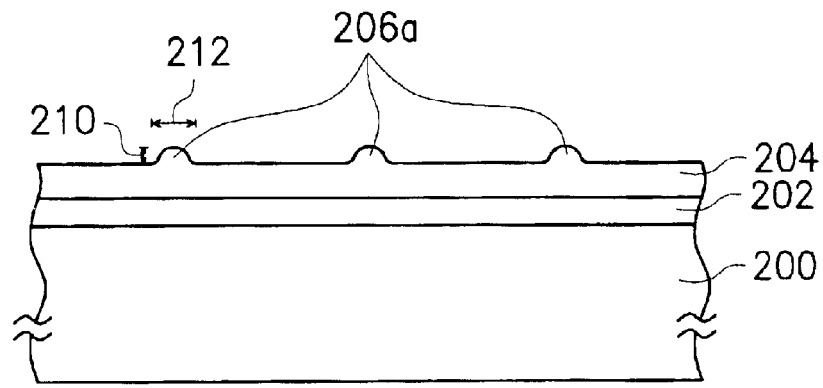

Referring to FIG. 2C, in which a step of performing a surface treatment on the substrate 200, on which the poly-silicon layer 204 is formed, is executed. The step comprises immerging the substrate 200 into a 1% ~15% concentration hydrofluoric acid for 1–5 minutes to perform a surface etching treatment so as to remove the oxide layer 208. Preferably, the substrate 200 is immerged into a 6% concentration hydrofluoric acid for 5 minutes to perform a surface etching treatment for obtaining a better result. Then, a second anneal treatment is performed on the poly-silicon layer 204, and the second anneal treatment is such as the laser anneal treatment. In this second anneal treatment, since the oxide layer 208 on the surface of the poly-silicon layer 204 had been removed by the etching method, the heat energy provided by the anneal treatment is more effectively transferred to the poly-silicon layer 204, thus the poly-silicon layer 204 is in a melt-out status as so to reduce the size of the mounds 206 existed on the surface of the poly-silicon layer 204. Further, the height/width ratio of the mound 206a is less than 0.2 as shown in FIG. 2D (height is 210 and width is 212).

In the fabricating process mentioned above, before the amorphous silicon layer 203 is formed, a buffer layer 202 is formed on the substrate 200 first, and then the amorphous silicon layer 203 is formed on the buffer layer 202.

The size of the mounds formed on the surface of the poly-silicon layer of the low temperature poly-silicon film formed by using the method mentioned above is significantly reduced.

After the poly-silicon layer 204 is formed on the substrate 200, a subsequent fabricating process is performed to form a TFT. Referring to FIG. 3, a gate isolation layer 214 is formed on the poly-silicon layer 204 and the substrate 200, wherein the gate isolation layer 214 is made of a material such as the silicon oxide or the silicon nitride. A gate 216 is then formed on the gate isolation layer 214. Then, a doping process is performed on the poly-silicon layer 204 so as to form a source 204a, a drain 204b, and a channel 204c deposited in between the source 204a and the drain 204b, wherein the doping method is such as an ion implantation method. Then, a dielectric layer 218 is formed on the gate 216 and the gate isolation layer 214, and the dielectric layer 218 and the gate isolation layer 214 are patterned to form an opening (not shown), wherein the opening exposes the source 204a and the drain 204b. Then, a source metal layer 220 and a drain metal layer 222 are formed on the surface of the dielectric layer 218 and the exposed opening of the source 204a and the drain 204b, wherein the source metal layer 220 is electrically connected to the source 204a, and the drain metal layer 222 is electrically connected to the drain 204b.

It is to be noted that if the source/drain (source/drain doped area) formed by the doping process mentioned above belongs to a N-type doped area, the method further comprises a step of forming a lightly doped drain (LDD) in between the channel and the source/drain.

The structure of the LTPS TFT of the present invention comprises a poly-silicon layer 204, a gate isolation layer 214, a gate 216, a dielectric layer 218, a source metal layer 220, and a drain metal layer 222.

The poly-silicon layer 204 is deposited on the substrate 200, and the poly-silicon layer 204 comprises a source 204a, a drain 204b, and a channel 204c deposited in between the source 204a and the drain 204b. Further, a plurality of mounds (not shown) is formed on the surface of the poly-silicon layer 204, and the height/width ratio of the mounds is less than 0.2.

The gate isolation layer 214 is deposited on the substrate 200 and covers the poly-silicon layer 204, and the gate 216 is deposited on the gate isolation layer 214, which is correspondingly deposited above the channel 204c. Further, the dielectric layer 218 is disposed on the gate isolation layer 214 and covers the gate 216 and the gate isolation layer 214.

The source metal layer 220 and the drain metal layer 222 are disposed on the surface of the dielectric layer 218 and in the dielectric layer 218 and the gate isolation layer 214, and electrically connected to the source 204a and the drain 204b, respectively. Besides this, the substrate 200 and the poly-silicon layer 204 further comprise a buffer layer 202.

In summary, the fabricating method of the TFT and its structure mentioned above provided by the present invention have the following advantages:

(1) The size of the mounds formed on the surface of the poly-silicon layer can be reduced by performing the surface treatment step, so that the height/width ratios of these mounds are all less than 0.2.

(2) Further, the height/width ratio of all mounds formed on the surface of the poly-silicon layer is less than 0.2 by performing the surface treatment step, so as to equalize the current characteristic of the elements. Accordingly, if these LTPS TFTs are used as the switches of the display element, a better display uniformity of the display panel can be provided.

(3) Besides this, the present invention is not limited to be only applied in the organic lightly emitting diode (OLED) display element or the liquid crystal display (LCD), instead any element that uses the LTPS TFT as its switch is suitable for applying the present invention.

Although the invention has been described with reference to a particular embodiment thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A low temperature poly-silicon thin film transistor (LTPS TFT), comprising:

a poly-silicon layer, deposited on a substrate, wherein the height/width ratio of a plurality of mounds on a surface of the poly-silicon layer is less than 0.2, but not zero and the poly-silicon layer comprises a source, a drain, and a channel that is deposited in between the source and the drain;

a gate isolation layer, deposited on the substrate, and covering the poly-silicon layer;

a gate, correspondingly deposited on the gate isolation layer that is deposited above the channel;

a dielectric layer, deposited on the gate isolation layer, and covering the gate;

a source metal layer, deposited on a surface of the dielectric layer and in the dielectric layer and the gate isolation layer wherein the source metal layer is electrically connected to the source; and a drain metal layer, deposited on the surface of the dielectric layer and in the dielectric layer and the gate isolation layer wherein the drain metal layer is electrically connected to the drain.

2. The low temperature poly-silicon thin film transistor of claim 1, further comprising a buffer layer in between the substrate and the poly-silicon layer.

* * * * *